(12) United States Patent
Stolyarova et al.

(10) Patent No.: US 7,527,999 B2
(45) Date of Patent: May 5, 2009

(54) $CD_{1-x}ZN_xS$ HIGH PERFORMANCE TCR MATERIAL FOR UNCOOLED MICROBOLOMETERS USED IN INFRARED SENSORS AND METHOD OF MAKING SAME

(75) Inventors: Sara Stolyarova, Haifa (IL); Yehuda Sinai, Haifa (IL); Moshe Weinstein, Mevaseret (IL); Avi Shai, Haifa (IL); Yael Nemirovsky, Haifa (IL)

(73) Assignee: Technion Research & Development Foundation Ltd., Haifa (IL)

( * ) Notice: Subject to any disclaimer, the term of this patent is extended or adjusted under 35 U.S.C. 154(b) by 254 days.

(21) Appl. No.: 11/294,677

(22) Filed: Dec. 6, 2005

(65) Prior Publication Data

US 2007/0128361 A1    Jun. 7, 2007

(51) Int. Cl.
*H01L 21/00*    (2006.01)
(52) U.S. Cl. ............... 438/57; 257/431; 257/E21.462; 257/E21.463
(58) Field of Classification Search .......... 257/431; 438/57
See application file for complete search history.

(56) References Cited

U.S. PATENT DOCUMENTS 4,549,088 A * 10/1985 Ozawa ............... 250/208.1

| | | |
|---|---|---|
| 5,286,976 A | 2/1994 | Cole |
| 5,718,761 A * | 2/1998 | Tokunaga et al. ............ 117/94 |
| 5,783,838 A * | 7/1998 | Kyozuka et al. ............. 257/21 |
| 5,801,383 A | 9/1998 | Wada et al. |
| 6,512,229 B2 | 1/2003 | Sasaki |

OTHER PUBLICATIONS

Hubert Jerominek and others, Vanadium Oxide Films for Optical Switching and Detection, Optical Engineering, Sep. 1993, pp. 2092 to 2099, vol. 32 No. 9, International Society for Optical Engineering (S P I E ), 1000 20th Street, Bellingham, WA 98225, USA.

D.P. Partlow and others, Switchable Vanadium Oxide Films by a Sol-Gel Process, Journal of Applied Physics, Jul. 1991, pp. 443 to 452, vol. 70 No. 1, American Institute of Physics, Suite 1NO1, 2 Huntington Quadrangle, Melville, NY 11747-4502, USA.

* cited by examiner

*Primary Examiner*—Alexander G Ghyka
(74) *Attorney, Agent, or Firm*—Edward Langer, Adv.; Shibolet & Co.

(57) ABSTRACT

A $Cd_{1-x}Zn_xS$ film material, with a high value of thermal coefficient of resistance, in the range of 1.5% to 3.7%. The $Cd_{1-x}Zn_xS$ material has excellent characteristics for use in a microbolometer-type uncooled infrared sensor. The film material can be deposited on microbolometer membranes or any other wafer for different applications. The film material can be deposited using the MOCVD technique, thermal evaporation or a different technique to form the film material over the wafer. The $Cd_{1-x}Zn_xS$ properties can be modified controlling certain deposition parameters and different annealing techniques. The process is performed at temperature compatible with CMOS technology.

15 Claims, 6 Drawing Sheets

$Cd_{1-x}Zn_xS$ HIGH PERFORMANCE TCR MATERIAL FOR UNCOOLED MICROBOLOMETERS USED IN INFRARED SENSORS AND METHOD OF MAKING SAME

FIELD OF THE INVENTION

The present invention generally relates to high thermoelectric coefficient of resistance (TCR) material, and more particularly to a method for manufacturing high thermo-electric coefficient of resistance (TCR) material comprising $Cd_{1-x}Zn_xS$ film, which is used in bolometer-type uncooled infrared sensors (enabling a two-dimensional infrared imaging apparatus) and like devices using temperature variation of resistance.

BACKGROUND OF THE INVENTION

A microbolometer is the latest type of thermal imaging Focal Point Array (FPA), which consists of materials that measure heat by changing resistance at each pixel. A microbolometer is a type of infrared detector, which absorbs the infrared (IR) radiation and warms slightly. The electrical resistance across the bolometer changes as a function of temperature, which can be measured and calibrated. The most common microbolometer material is vanadium oxide (VOx). Amorphous silicon (a-Si) is another microbolometer material. The a-Si model has poor dynamic range and isothermal scene performance, which limits the current version(s) for many fire service applications.

It has been the practice in a bolometer type infrared sensor to use a titanium oxide film, a vanadium oxide film or a similar film. Examples are described in U.S. Pat. No. 5,286,976 issued to Barret E. Cole, U.S. Pat. No. 5,801,383 issued to Hideo Wada, an article contributed by Hubert Jerominek and others to Optical Engineering, v.32 (1993) n.9, pages 2092 to 2099 under the title of "Vanadium Oxide Films for Optical Switching and Detection," an article contributed by D. P. Partlow and others and to Journal of Applied Physics, v.70 (1991) n.1, pages 443 to 452, under the title "Switchable Vanadium Oxide Films by a Sol-Gel Process." Partlow discloses that vanadium oxide has thirteen distinct phases between vanadium dioxide and vanadium sesquioxide (rendering this material not stable enough).

Titanium oxide has a specific resistance as low as 0.01 Ohm.cm, however, the temperature coefficient is not so great in absolute value, being −0.2% per degree Celsius. On the other hand the specific resistance of vanadium dioxide is about 10 Ohm-cm when manufactured by sputtering. Its temperature coefficient is about −2%, when manufactured without additional temperature treatment. When additional thermal treatment is included, the TCR can be increased to 4% (see, for example, U.S. Pat. No. '383 to Wada). However the treatment temperature is more than 350° C., which is not sufficiently compatible with the very large scale integrated circuit (VLSI) manufacturing process of the whole infrared sensor. Moreover, as described in U.S. Pat. No. '383, to Wada, the vanadium dioxide is susceptible to a metal-semiconductor phase transition at about 70° C. This gives rise to a volume variation of vanadium dioxide and causes cracks and peel off to render a vanadium oxide film unreliable when it is used in the bolometer-type infrared sensor device, which is unavoidably subjected to temperature cycles passing through 70° C.

In U.S. Pat. No. 6,512,229 to Saski, et al, a process for preparing the crystal phase of $V_2O_3$, with x=1.5 in $VO_x$ is disclosed. A TCR of about 2-4% is obtained after applying a heat treatment of 380° C. for 8 hours in hydrogen. However, the resistivity of these films is too low, about $10^{-3}$-$10^{-4}$ Ohm-cm. To tailor the resistivity to the needed values, about $10^{-1}$ Ohm-cm, an additional oxidation heat treatment was applied.

Thus, it would be advantageous to provide a microbolometer film material with a high value of thermal coefficient of resistance, fabricated at temperatures compatible with CMOS technology.

SUMMARY OF THE INVENTION

Accordingly, It is a principal object of the present invention to provide a material with excellent characteristics for use in a bolometer-type infrared sensor.

It is another principal object of the present invention to provide a $Cd_{1-x}Zn_xS$ film, which has a high temperature coefficient of specific resistivity for use in bolometer-type sensors.

It is one other principal object of the present invention to provide a method for manufacturing microbolometer film material $Cd_{1-x}Zn_xS$, with a thermal coefficient of resistance in the range of values from 1.5% to 3.7 %, for use at temperatures compatible with CMOS technology.

A method is disclosed for manufacturing a film material, $Cd_{1-x}Zn_xS$, with a high value of thermal coefficient of resistance, in the range of 1.5% to 3.7%, wherein the film material can be deposited on a wafer. The method includes varying the composition of the deposited film material by adding a Zn component in accordance with $Cd_{1-x}Zn_xS$. The method also includes establishing other deposition parameters including pressure, temperature, in order to determine resistivity of the deposited film material, growth rate and wafer type. Other steps include depositing the film material on the wafer and performing an annealing technique, such that the film material is fabricated at temperatures compatible with CMOS technology.

The film material of the present invention may be used in a predictive maintenance device, a fire safety device, security systems, night vision systems, living being detection sensors, satellite photography and for ultrasonic wave detection.

The film material can be deposited on microbolometer membranes or any other wafer for different applications. The film material can be deposited using the Metal-Organic Chemical Vapor Deposition (MOCVD) technique, thermal evaporation or a different technique to form the film material over the wafer. The $Cd_{1-x}Zn_xS$ properties can be modified controlling certain deposition parameters and different annealing techniques. The process is performed at low temperature compatible with CMOS technology.

Additional features and advantages of the invention will become apparent from the drawings and descriptions contained herein below.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF PREFERRED EMBODIMENTS

The principles and operation of a method and a system according to the present invention may be better understood with reference to the drawings and the accompanying description, it being understood that these drawings are given for illustrative purposes only and are not meant to be limiting.

In one preferred embodiment of the present inventions, CdZnS films have been grown in a 2 inch horizontal reactor of Thomas Swan low pressure MOCVD system. Note that in general, the chemical designation for the film is $Cd_{1-x}Zn_xS$, where (0<x<1). Then, when x=0, the designation is CdS.

Three kinds of substrates were used for the Metal Organic Vapor Phase Epitaxy (MOVPE) growth. There were glass slides; silicon wafers with 100 nm PECVD nitride; and silicon wafers with 100 nm Plasma Enhanced Chemical Vapor Deposition (PECVD) oxide. Metalorganic precursors used for the growth were dimethylcadmium (DMCd), diethylzinc (DEZn) and t-butylmercaptan. Hydrogen purified by diffusion through palladium was used as a gas carrier. The growth processes were performed at total pressures of 100 Torr and 300 Torr and total flow of 2 liters/min. High total flow velocity was used to increase compositional homogeneity of the gas flow. The epilayers were grown at 300° C. at a growth rate of about 1 μm/h.

Figure 1:
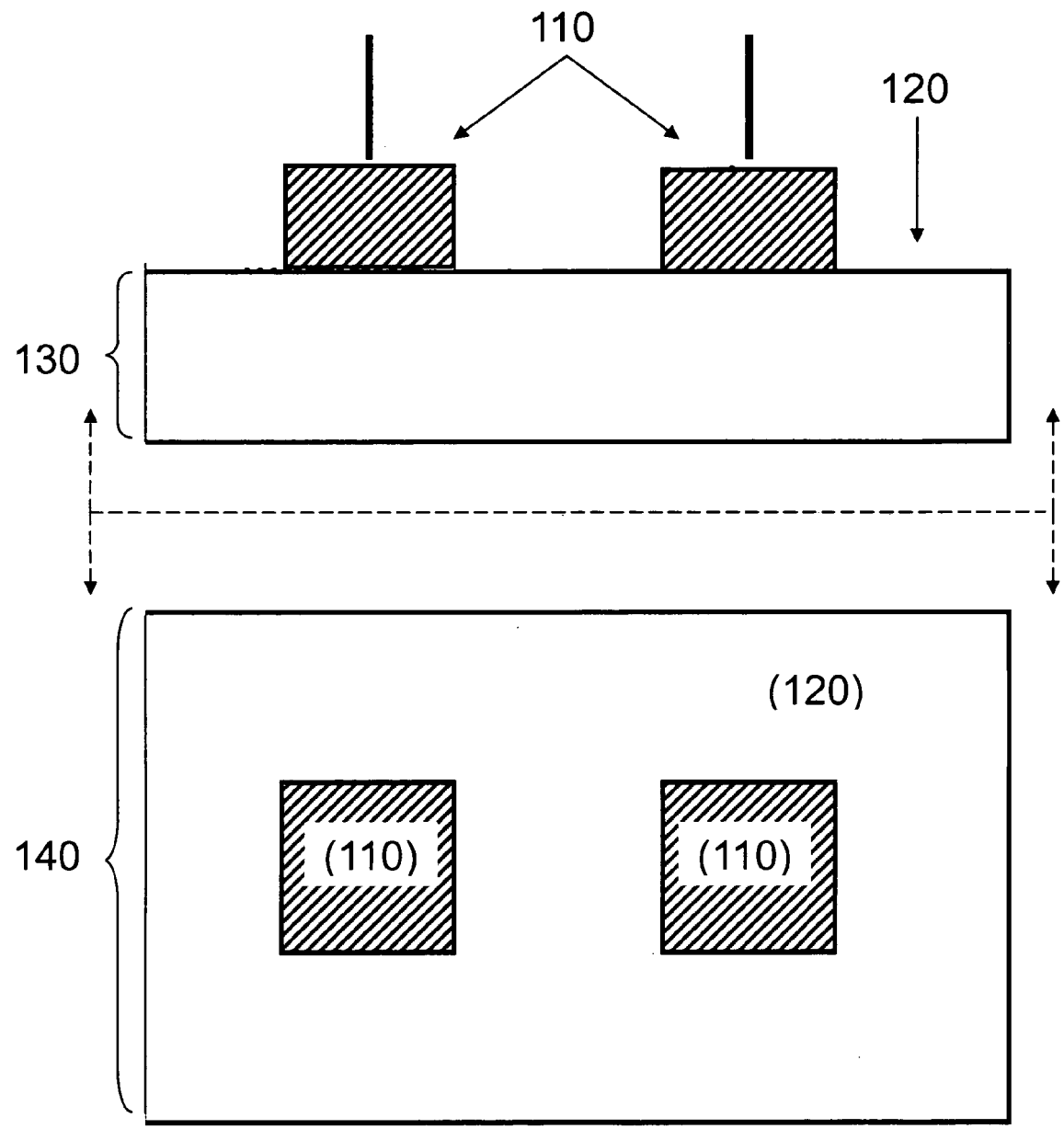
FIG. 1 is a schematic illustration of the electrical contacts on the CdS film surface, constructed in accordance with the principles of the present invention.

FIG. 1 is a schematic illustration of the electrical contacts 110 on the CdZnS film surface 120, constructed in accordance with the principles of the present invention. The electrical resistance was measured using two contacts 110 evaporated on CdZnS surface 120. Surface 120 is shown in a side view 130 and an orthogonal top view 140. The configuration of the contacts allowed the measurement of the square sheet, resistance. Ti, Al or Ti/Au were used as the contact materials.

According to semiconductor theory, resistance depends on temperature as $$R(T)=R_0 \cdot \exp(-E_a/KT). \quad (1)$$

Temperature coefficient of resistance TCR is defined as:

$$TCR(T)=1/R \ast dR/dT=-E_a/KT^2 \quad (2)$$

Maximum possible activation energy ($E_a$) is equal to $E_{gap}/2$.

$E_a$ for single crystalline material is equal to $E_{gap}/2$, where $E_{gap}$ is the band gap energy. For polycrystalline materials, such as $Cd_{1-x}Zn_xS$, the additional delta $E_a$ related to grain boundary barrier height is present. Actual activation energy for the material includes the energy of the donor level plus the energy of the grain boundary barrier.

The resistance and TCR data of MOCVD deposited films are summarized in Table 1 herein below. The temperature dependence of the resistance showed typical semiconductor behavior (referring now to FIG. 2, below). From the temperature dependence of R, the activation energy and TCR were calculated according to formula (1) above.

The sheet resistance varies non-linearly with the film thickness, evidently due to quantum effects acting in the nano-structured films. For the 2000 A thick CdZnS films, the R values are about 200-300 kOhm, i.e. suitable for the bolometric measurements. The resistivity was 4-6 Ohm-cm. For the CdS films with the thickness equal or less than 2000 A the TCR was in the range 1.4%-2.4%.

That TCR values varied insignificantly for different substrates can be related to the differences in grain size and morphology. The grain size of the 100 nm thick films was about 30 nm for glass substrate and 50 nm for SiO$_2$/silicon and Si$_3$N$_4$/silicon substrates. The roughness of the films was low and fulfilled the device fabrication requirements. RMS of CdS films is found to be 5.5 nm on glass, 4.3 nm on Si$_3$N$_4$/silicon and 4.4 nm on SiO$_2$/silicon.

In an alternative preferred embodiment, in order to further raise the TCR, a Zn component was added to the film. According to theory, the addition of Zn should increase the TCR because the $E_{gap}$ of ZnS is greater than that of CdS. Indeed, even small concentrations of Zn increased TCR by up to 3.7%. However, at the same time, the resistance of the film also increases with Zn concentration. So the Zn concentration should be optimized for each specific application.

Figure 2:
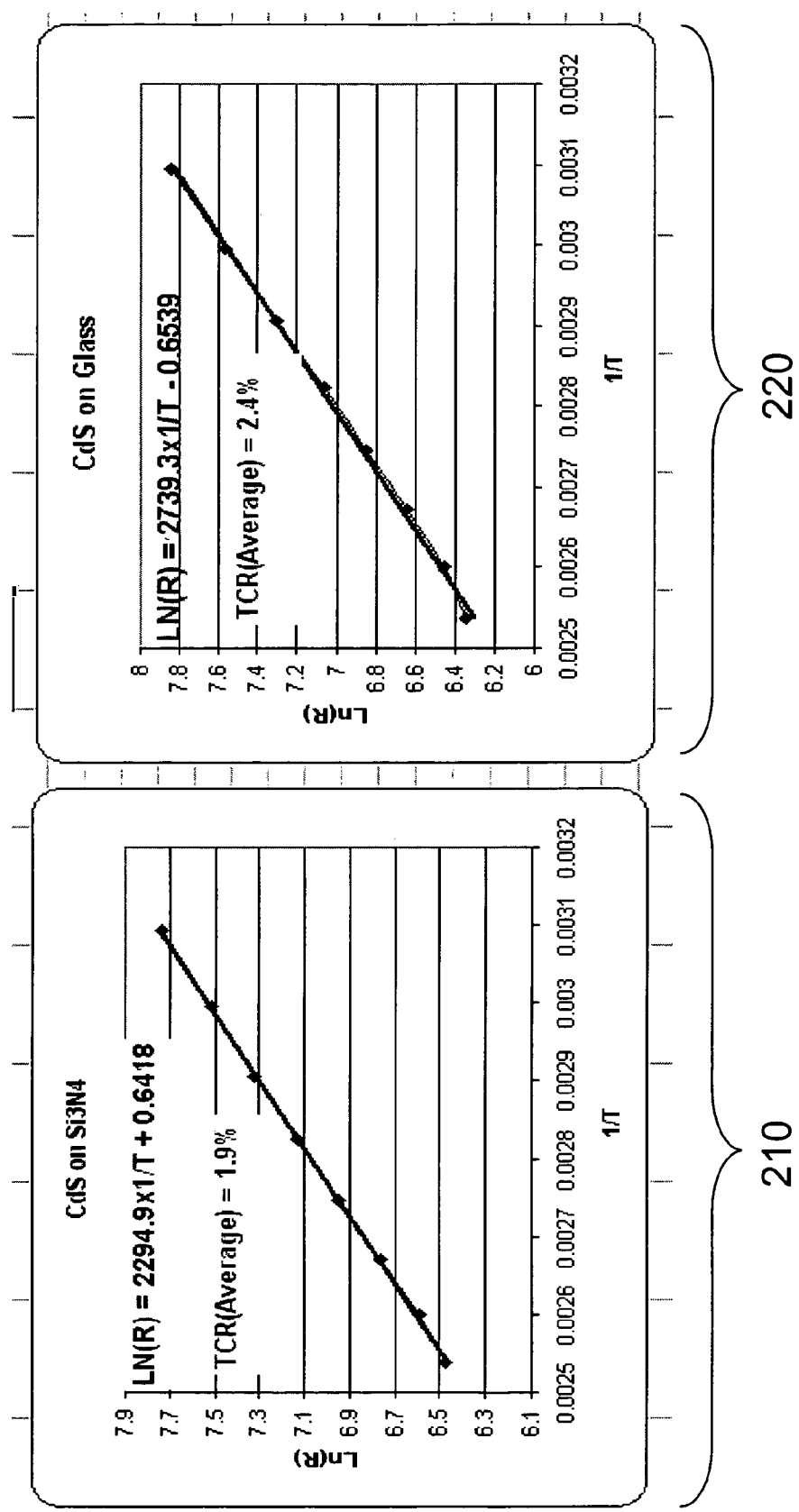
FIG. 2 is a graphical representation of electrical resistance versus 1/T for appropriate $TCR_{avg}$ of CdS on nitride and glass, in accordance with the principles of the present invention.

FIG. 2 is a graphical representation of electrical resistance versus 1/T for appropriate TCR$_{avg}$ of CdS on nitride 210 and glass 220, in accordance with the principles of the present invention.

Table 1 presents TCR data for MOCVD deposited CdZnS films:

| Material | Thickness, A | Resistance kOhm | TCR % |
|---|---|---|---|
| CdS/glass | 4000 | 20 | 1.0 |
| CdS/glass | 2000 | 220 | 2.2 |
| CdS/nitride | 2000 | 330 | 1.8 |
| CdS/glass | 1500 | 2540 | 2.8 |
| CdS/nitride | 1500 | 2300 | 2.5 |
| CdS/SiO$_2$ | 1500 | 2400 | 2.6 |
| Cd$_{0.94}$Zn$_{0.06}$S/glass | 2000 | 5200 | 3.7 |
| Cd$_{0.86}$Zn$_{0.14}$S/glass | 1800 | >20000 | |

In another preferred embodiment, CdS films were deposited by thermal evaporation in vacuum 10-6 Torr. CdS granules were used for evaporation from the crucible, heated resistively by 27 A current. The substrates were at room temperature. The deposition rate was 0.08 μm/min. The thickness was monitored by the deposition time. The substrates were Si wafers covered by nitride film. The TCR values are close to 3%.

Table 2 presents the TCR of CdS films deposited on nitride/silicon by thermal evaporation:

| Resistance [KOhm/square] | TCR [%] | CdS thickness, Å |
|---|---|---|
| 370 | 2.38 | 3000 |
| 760 | 2.97 | 1500 |
| 1400 | 2.83 | 1350 |
| 1000-2000 | 2.2-3.7 | 1000 |
| 2200 | 3.6 | 800 |

In a fourth preferred embodiment, the CdS (1350 Å) films were deposited by thermal evaporation as in the previous example. After deposition, the samples were annealed at 200° C. in a hydrogen atmosphere at 500 Torr for 20 min. The sheet resistance dropped from 1.4 MOhm to 400 kOhm, while the TCR changed from 2.8 to 1.6%. Similar results were obtained with annealing at 240° C. in a hydrogen atmosphere at 500 Torr for 5 min. The resistance drop can be explained by better organization of grain boundary regions in the film during annealing leading to the decrease of potential barriers at the grain boundaries, as well as by grain size growth (with reference to FIGS. 3, 4 below).

Table 3 shows the values of thickness, thermoelectric coefficient of resistance (TCR) before and after annealing and resistance before and after annealing for a variety of environments, including a vacuum.

TABLE 3 presents CdS annealing in different environments:

| Annealing Parameters | CdS thickness Å | TCR before annealing [%] | TCR after annealing [%] | Resistance before annealing [KOhm/square] | Resistance after annealing [KOhm/square] |
|---|---|---|---|---|---|
| Hydrogen/200° C./20 min | 1350 | 2.2 | 1.6 | 1400 | 400 |
| Nitrogen//200° C./5 min | 1000 | 2.8 | 1.5 | 2000 | 320 |
| Vacuum//200° C./5 min | 1000 | 2.8 | 1.3 | 2000 | 180 |
| NF3/200° C./5 min | 800 | 3.6 | 1.1 | 2200 | 300 |

Figure 5:
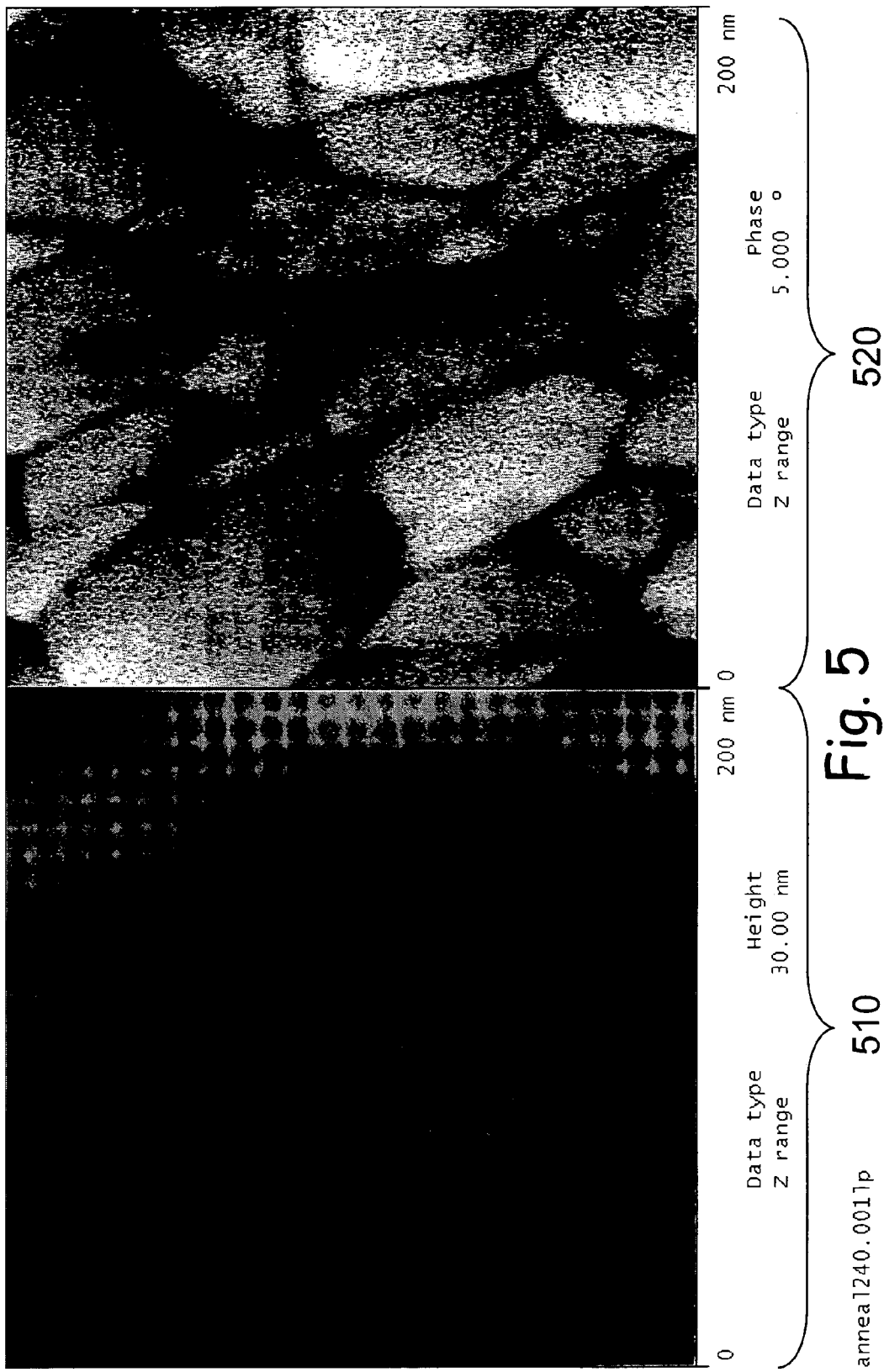
FIG. 5 is a screen shot of AFM patterns AFM pattern of CdS film deposited on nitride by vacuum evaporation after annealing in hydrogen at 240° C. for 5 min, showing height contrast on the left and phase contrast on the right, constructed in accordance with the principles of the present invention.

In yet another preferred embodiment, the CdS (800 Å) films were deposited by thermal evaporation. After the deposition the samples were annealed at 200° C. in NF3/N2 (1:1) atmosphere at 60 Torr for 5 min. The sheet resistance dropped from 2.2 MOhm to 300 kOhm while the TCR changed from 3.6% to 1.1%. The AFM results show the significant recrystallization and grain growth (FIG. 5).

In a sixth preferred embodiment, the CdS (1000 A) films were deposited by thermal evaporation. After the deposition the samples were annealed at 200° C. in a nitrogen environment at 60 Torr for 5 min. The sheet resistance dropped from 2.0 MOhm to 180 kOhm, while the TCR changed from 2.8% to 1.5%.

In a seventh preferred embodiment, the CdS (1000 A) films were deposited by thermal evaporation. After the deposition, the samples were annealed at 200° C. in a vacuum environment for 5 min. The sheet resistance dropped from 2.0 MOhm to 180 kOhm, while the TCR changed from 2.8% to 1.3%. It is critical that the high TCR layer does not change in time. In an eighth preferred embodiment the CdS film (1300 Å) was covered by a ZnS film (300 Å). The ZnS layer plays the role of a passivation protective layer for CdS as well as for CdZnS. The TCR was 2.8% and the resistance was 1 MOhm. The data were stable over an observation period of 6 months.

In contrast to vanadium dioxide, the $Cd_{1-x}Zn_xS$ films do not exhibit solar bleeching. Solar cells containing $Cd_{1-x}Zn_xS$, are established devices for use in extreme conditions, such as in cosmic space.

Figure 3:
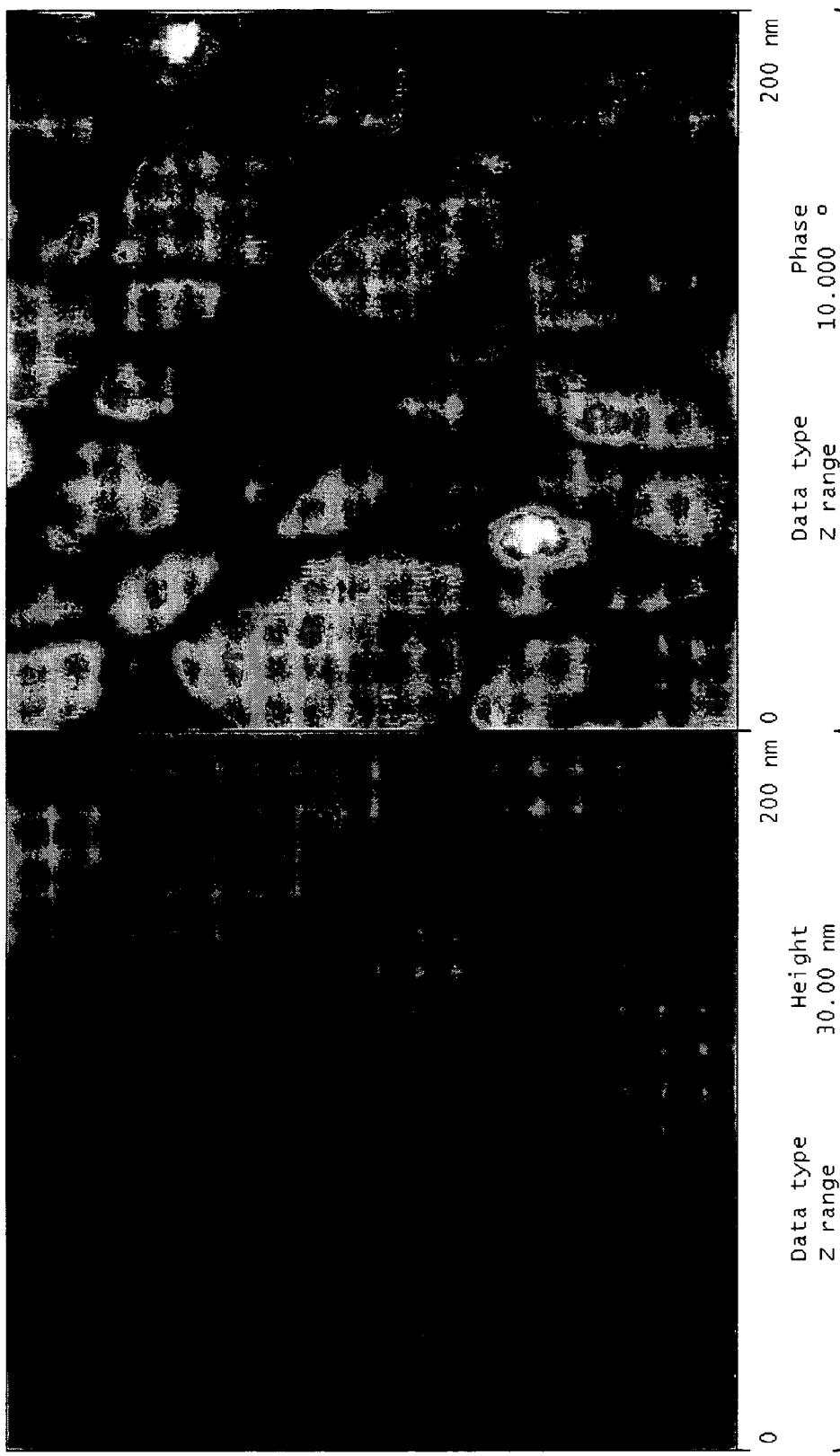
FIG. 3 is a screen shot of Atomic Force Microscopy (AFM) patterns of CdS films deposited on nitride by vacuum evaporation, showing height contrast on the left and phase contrast on the right, constructed in accordance with the principles of the present invention.

FIG. 3 is a screen shot of Atomic Force Microscopy (AFM): patterns of CdS films deposited on nitride by vacuum evaporation, showing height contrast on the left 310 and phase contrast on the right 320, constructed in accordance with the principles of the present invention.

Figure 4:
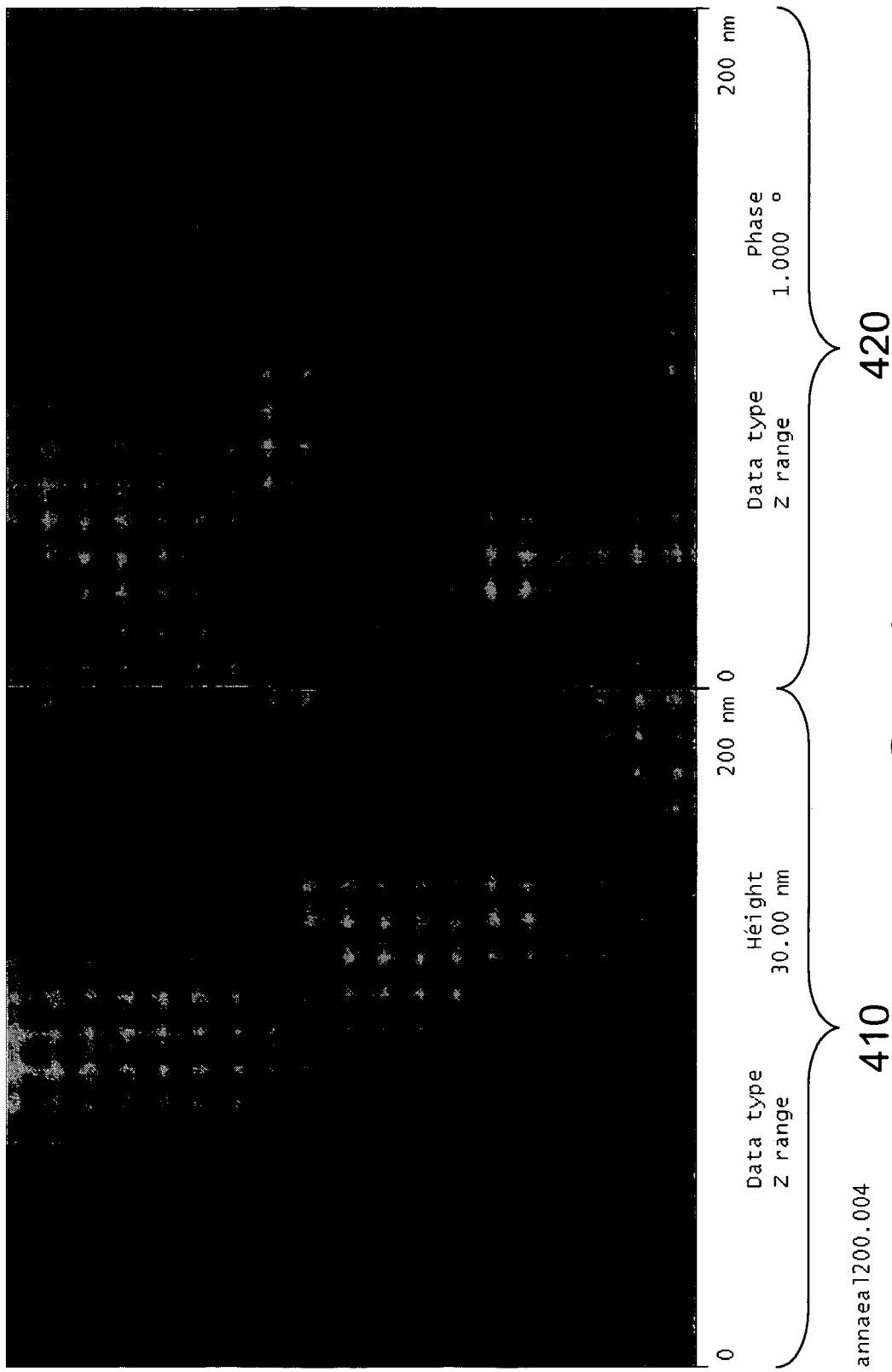
FIG. 4 is a screen shot of AFM patterns of CdS film deposited on nitride by vacuum evaporation after annealing in hydrogen at 200° C. for 20 min, showing height contrast on the left and phase contrast on the right, constructed in accordance with the principles of the present invention.

FIG. 4 is a screen shot of AFM patterns of CdS films deposited on nitride by vacuum evaporation after aging in hydrogen 200° C. for 20 min, showing height contrast on the left 410 and phase contrast on the right 420, constructed in accordance with the principles of the present invention.

FIG. 5 is screen shot of AFM patterns of CdS films deposited on nitride by vacuum evaporation after aging in hydrogen 240° C. for 5 min, showing height contrast on the left 510 and phase contrast on the right 520, constructed in accordance with the principles of the present invention.

Figure 6:
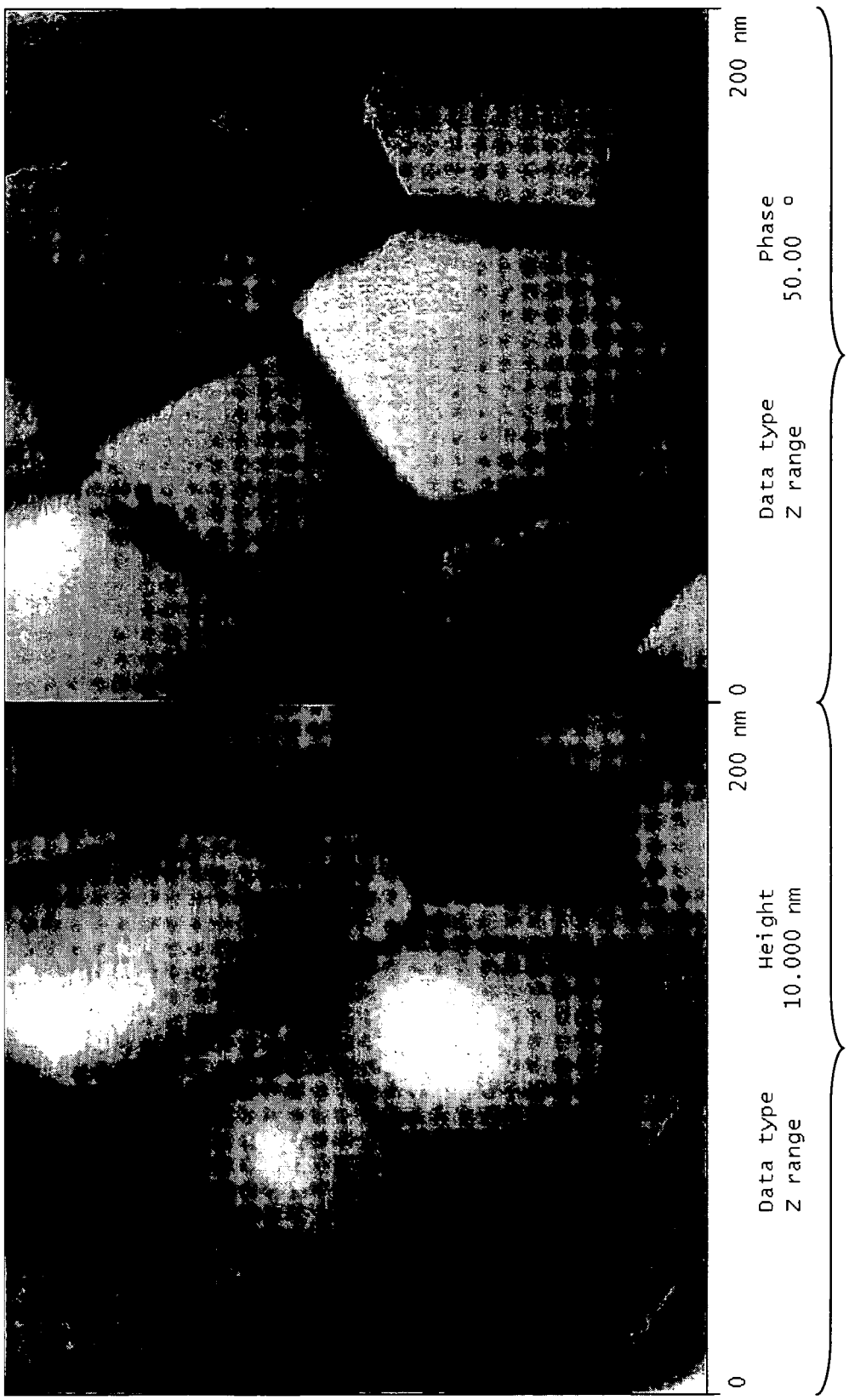
FIG. 6 is a screen shot of AFM the microstructure of CdS films deposited on nitride by vacuum evaporation after annealing in NF$_3$ at 200° C. for 5 min, showing height contrast on the left and phase contrast on the right, constructed in accordance with the principles of the present invention.

FIG. 6 is screen shot of AFM patterns of CdS films deposited on nitride by vacuum evaporation after annealing in $NF_3$ at 200° C. for 5 min, showing height contrast on the left 610 and phase contrast on the right 620, constructed in accordance with the principles of the present invention.

It is to be understood that the phraseology and terminology employed herein are for the purpose of description, and should not be regarded as limiting.

It is important, therefore, that the scope of the invention is not construed as being limited by the illustrative embodiments set forth herein. Other variations are possible within the scope of the present invention as defined in the appended claims and their equivalents.

We claim:

1. A film material for microbolometers used in uncooled infrared sensors comprising:
    at least one of a cadmium component and a zinc component; and
    a sulfur component,
    said film material being represented as $Cd_{1-x}Zn_xS$, wherein x has a value in the range of approximately 0-0.06, and wherein said value of thermal coefficient of resistance (TCR) is in the range of 1.5% to 3.7%, said film material being capable of deposition to form a thickness of no more than approximately 2000 Angstrom on a wafer, said deposited film material providing a relatively high value of TCR and being capable of fabrication at temperatures compatible with and not harmful to CMOS devices present on said wafer.

2. The material of claim 1, wherein said deposited film material is applied to a microbolometer.

3. The material of claim 1, wherein said deposited film material is applied to an uncooled infrared detector.

4. The material of claim 2, wherein a layer of ZnS is applied to said microbolometer as a passivation layer.

5. The material of claim 1, wherein said material is stable in the sun and is thereby insensitive to bleaching.

6. The material of claim 1, wherein said material is deposited by thermal evaporation.

7. The material of claim 1, wherein said material is deposited by a Metal-Organic Chemical Vapor Deposition (MOCVD) technique.

8. The material of claim 1, for use in a predictive maintenance device.

9. The material of claim 1, for use in a fire safety device.

10. The material of claim 1, for use in security systems.

11. The material of claim 1, for use in night vision systems.

12. The material of claim 1, for use in living being detection sensors.

13. The material of claim 1, for use in satellite photography.

14. The material of claim 1, for use in ultrasonic wave detection.

15. A film material for microbolometers used in uncooled infrared sensors manufactured by a method comprising:
   performing a growth process to obtain a film material comprising:
   at least one of a cadmium component and a zinc component; and
   a sulfur component,
   said film material being represented by $Cd_{1-x}Zn_xS$, wherein x has a value in the range of approximately 0-0.06, and wherein said value of thermal coefficient of resistance (TCR), is in the range of 1.5% to 3.7%, said film material being capable of deposition to form a thickness of no more than approximately 2000 Angstrom on a wafer;
   depositing said film material on said wafer by establishing deposition parameters comprising:
   pressure;
   temperature, in order to determine resistivity of said deposited film material;
   growth rate; and
   wafer type;
   and
   performing an annealing technique,
   such that said film material provides a relatively high value of TCR and is fabricated at temperatures compatible with and not harmful to GAGS devices present on said wafer.

* * * * *